(12) United States Patent
Israel et al.

(10) Patent No.: US 11,227,853 B2
(45) Date of Patent: Jan. 18, 2022

(54) METHOD OF MANUFACTURING AN LED CARRIER ASSEMBLY HAVING AN EMBEDDED ALIGNMENT MAGNET

(71) Applicant: Lumileds LLC, San Jose, CA (US)

(72) Inventors: Casey Israel, Brüggen (DE); Florent Monestier, Kerkrade (NL); Benno Spinger, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/466,901

(22) PCT Filed: Nov. 30, 2017

(86) PCT No.: PCT/EP2017/080925
§ 371 (c)(1),
(2) Date: Jun. 5, 2019

(87) PCT Pub. No.: WO2018/104138
PCT Pub. Date: Jun. 14, 2018

(65) Prior Publication Data
US 2019/0304950 A1 Oct. 3, 2019

(30) Foreign Application Priority Data
Dec. 9, 2016 (EP) .................................. 16203176

(51) Int. Cl.
*H01L 23/00* (2006.01)
*H01L 25/075* (2006.01)
(Continued)

(52) U.S. Cl.
CPC .......... *H01L 24/97* (2013.01); *H01L 25/0753* (2013.01); *H01L 33/0095* (2013.01);
(Continued)

(58) Field of Classification Search
CPC ................. H01L 24/97; H01L 25/0753; H01L 2203/104; H01L 2224/95144;
(Continued)

(56) References Cited

U.S. PATENT DOCUMENTS 4,942,140 A * 7/1990 Ootsuki .................. H01L 21/56
174/535
5,915,749 A 6/1999 Baldwin
(Continued)

FOREIGN PATENT DOCUMENTS

JP 2014-090052 A * 5/2014 ............. H01L 33/62
JP 2014090052 A 5/2014

*Primary Examiner* — Khiem D Nguyen
(74) *Attorney, Agent, or Firm* — Volpe Koenig

(57) ABSTRACT

The invention describes a method of manufacturing an LED carrier assembly, which method comprises the steps of providing a carrier comprising a mounting surface with mounting pads arranged to receive a number of LED dies; embedding an alignment magnet in the carrier; providing a number of LED dies, wherein an LED die comprises a number of magnetic die pads; and aligning the magnetic die pads to the mounting pads by arranging the LED dies over the mounting surface of the carrier within magnetic range of the alignment magnet. The invention also describes an LED carrier assembly.

19 Claims, 4 Drawing Sheets

(51) Int. Cl.
  *H01L 33/62* (2010.01)
  *H01L 33/00* (2010.01)
  *H05K 3/32* (2006.01)

(52) U.S. Cl.
  CPC ............ *H01L 33/62* (2013.01); *H05K 3/325* (2013.01); *H01L 2224/95085* (2013.01); *H01L 2224/95144* (2013.01); *H01L 2933/0066* (2013.01); *H05K 2201/083* (2013.01); *H05K 2201/10106* (2013.01); *H05K 2203/104* (2013.01); *H05K 2203/166* (2013.01)

(58) Field of Classification Search
  CPC ... H05K 2201/10106; H05K 2201/083; H05K 2203/104; H05K 2203/166; H05K 2224/95144
  USPC ......................................................... 257/88
  See application file for complete search history.

(56) References Cited

U.S. PATENT DOCUMENTS

| | | | | |
|---|---|---|---|---|
| 8,253,210 B2* | 8/2012 | Theuss | .................. | B82Y 25/00 257/421 |
| 8,907,370 B2* | 12/2014 | Tischler | .................. | F21V 7/30 257/99 |
| 9,721,931 B2* | 8/2017 | Huang | ................ | H01L 33/0093 |
| 2004/0016998 A1* | 1/2004 | Fonstad | .............. | H01L 21/6835 257/678 |
| 2006/0197213 A1* | 9/2006 | Lian | .................. | G06K 19/07749 257/687 |
| 2007/0155025 A1 | 7/2007 | Zhang et al. | | |
| 2008/0265367 A1* | 10/2008 | Tan | ........................ | H01L 24/81 257/531 |
| 2008/0277677 A1 | 11/2008 | Kuo et al. | | |
| 2012/0012868 A1* | 1/2012 | Chang | .................... | H01L 33/48 257/91 |
| 2013/0168708 A1* | 7/2013 | Shibata | ................... | H01L 24/75 257/88 |
| 2015/0107765 A1* | 4/2015 | Khanna | .................. | H01L 24/29 156/272.4 |
| 2016/0293811 A1* | 10/2016 | Hussell | ................. | H01L 27/156 |
| 2017/0038055 A1* | 2/2017 | Daniels | .................. | H01L 24/00 |
| 2017/0141021 A1* | 5/2017 | Agrawal | ................ | H01L 23/544 |
| 2017/0148771 A1* | 5/2017 | Cha | ........................ | H05K 3/301 |
| 2017/0154919 A1* | 6/2017 | Chen | .................. | H01L 21/6835 |

* cited by examiner

METHOD OF MANUFACTURING AN LED CARRIER ASSEMBLY HAVING AN EMBEDDED ALIGNMENT MAGNET

FIELD OF THE INVENTION

The invention describes a method of manufacturing an LED carrier assembly. The invention further describes an LED carrier assembly and an LED.

BACKGROUND OF THE INVENTION

To assemble or manufacture an electronic device comprising multiple electronic components, surface-mount technology (SMT) is widely used as an established method of mounting the electronic components at their designated positions on a printed circuit board (PCB). SMT component placement systems such as pick-and-place machines can precisely and rapidly place the electronic components onto previously deposited solder pads, which are then soldered into place, for example in a reflow solder oven. A light-emitting diode (LED) die for mounting onto a carrier such as a PCB may comprise the die itself and die pads for connection to tracks on the carrier. To facilitate SMT mounting, handling and the formation of electrical connections, to provide environmental protection, etc., an LED die may also comprise some appropriate packaging. In the following, the terms "LED die" and "LED" may be used interchangeably. The terms "LED pad" and "die pad" may also be used interchangeably.

The electrode contacts of an SMT LED are also usually soldered in place on a PCB. The solder connection between an LED die pad and a PCB pad has favourably low electrical and thermal resistance. However, soldering an LED die in place is associated with a number of problems. Firstly, all solders will melt at high enough temperature, and the solder bond between LED die and PCB therefore limits the permissible junction temperature of the LED die. An excessively high junction temperature would soften or even melt the solder, and the LED die may detach from the PCB. Secondly, the material properties of the solidified solder are such that voids or cracks can form upon repeated temperature cycling, thereby lowering the thermal shock (TMSK) reliability of the finished product. Secondly, uncertainties and randomness in the amount of solder and in the melting and solidification processes during soldering mean that an LED mounted by a solder bond may suffer from misalignment in any of the three dimensions (X, Y, and Z) and may be rotated or tilted out of a desired mounting plane. A misalignment in the Z direction is usually the most problematic, particularly in the case of lighting applications that have precisely specified light output characteristics. Furthermore, the different materials used for the LED and the PCB means that the coefficient of thermal expansion (CTE) of an LED is significantly different from the CTE of the PCB. This CTE mismatch is essentially unavoidable, and the rigid solder bonded to the LED die pads will physically stress the LED during operation, and also during storage, especially at cold temperatures. The CTE mismatch may ultimately shorten the lifetime of the LED and therefore also the lifetime of the product.

It has been proposed to use magnetic fields to assist in the alignment of semiconductor packages and a PCB. For example, U.S. Pat. No. 5,915,749 proposes adding a layer of magnetic material onto the top of an integrated circuit, and embedding a magnetic material in the PCB. Once the integrated circuit is aligned in the desired orientation relative to the conductive traces on the PCB, the legs of the integrated circuit are soldered to bonding sites at the ends of conductive traces on the PCB. US2008/0265367A1 considers a different approach, in which inductive rings or coils are embedded in a semiconductor package and also in corresponding locations in the PCB. Using two solenoid coils, magnetic fields are induced in the inductive rings so that the semiconductor package aligns with the carrier and can then be soldered into place. However, such methods are only suitable when the semiconductor package is relatively large, for example an integrated circuit with many legs or leads. These methods are not suitable for the alignment of very small packages such as LED packages. In an alternative approach, JP2014-90052A considers providing an LED package with magnetic die pads, and arranging corresponding magnetic contact pads on the PCB or carrier. However, it can be costly to prepare a carrier with magnetic contact pads.

It is an object of the invention to provide a way of mounting LEDs onto a carrier to overcome the problems outlined above.

SUMMARY OF THE INVENTION

The object of the invention is achieved by the method of claim 1 of manufacturing an LED carrier assembly and by the LED carrier assembly of claim 8.

According to the invention, the method of manufacturing an LED carrier assembly comprises the steps of providing a carrier comprising a mounting surface with mounting pads arranged to receive a number of LED dies; embedding a magnet below the mounting surface of the carrier; providing a number of LED dies, wherein an LED die comprises a number of magnetic die pads; and aligning the magnetic die pads of an LED die to mounting pads by arranging the LED die on the mounting surface of the carrier within magnetic range of a magnet. The electrical and thermal connection between the LED die pads and mounting pads is solderless, and is made by the physical contact between these opposing surfaces.

The inventive LED carrier assembly comprises a carrier which has a mounting surface prepared with mounting pads that are arranged to receive a number of LED dies. The LED carrier assembly further comprises a number of LED dies, wherein an LED die has a number of magnetic die pads which are aligned to the mounting pads by a magnetic force between the magnetic die pads and a magnet embedded below the mounting surface of the carrier. The step of embedding a magnet below the mounting surface of the carrier is to be understood to mean that the body of the magnet does not extend above the mounting surface of the carrier.

In the context of the invention, the term "carrier" may be understood to comprise any suitable material that can be prepared to receive electronic components. Generally, a carrier may be understood to be a printed circuit board (PCB) having conductive tracks, pads, etc. formed on a non-conductive substrate. In the following, the terms "carrier" and "PCB" may be used interchangeably. The carrier can be made of any suitable material such as FR-4, aluminium metal core board, ceramic, etc., and the conductive tracks and pads can be formed using any suitable procedure such as etching, as will be known to the skilled person.

An advantage of the inventive method and LED carrier assembly is that instead of solder, a magnetic force is used to establish the electrical connection between an LED and the carrier. The connection between LED and PCB is therefore a solderless connection, and overcomes the disadvantages mentioned in the introduction: the LED junction temperature is no longer constrained or limited by solder; there is no longer any risk of voids and cracks developing between the LED die pads and the PCB pads even after repeated temperature cycling; and the LED is no longer subject to stress arising from a CTE mismatch between the LED itself and the PCB.

There are further advantages arising from the inventive method. For example, the LEDs no longer need to be exposed to high-temperatures during soldering. This means that cheaper LEDs with lower thermal specifications may be used, thereby reducing the bill of materials for the LEDs. The inventive method can also enable a "self-alignment" of the LEDs relative to the carrier, as will be explained below, so that the LEDs do not need to be handled sequentially by a pick-and-place machine, resulting in a favourably fast and low-cost assembly process, especially as the number of LEDs per PCB increases. Another advantage is that the absence of any solder bond between LED die and PCB pad means that the LEDs can be more accurately placed, and the inventive method allows a very precise alignment—especially in the Z direction—to be achieved. In the inventive method, the accuracy of LED placement is significantly improved because an LED will stay where it is placed, i.e. exactly in the desired mounting plane. Furthermore, the absence of solder means that the orientation of an LED is determined by the flatness of the PCB, and not by a solder layer of variable thickness and uneven surface. Another advantage of the inventive method is that when rework is required (for example to replace a non-functional LED on a PCB), an LED can be simply picked up off the PCB with a suitable tool such as tweezers, a pick-and-place machine, vacuum tweezers, etc.

A die used in the inventive LED carrier assembly may comprise a light-emitting diode with an anode pad and a cathode pad. At least one of these electrode pads (preferably both) comprises a number of layers of magnetic material. A magnetic electrode contact can be realized in a relatively straightforward manner, using any established technique that would otherwise be used to form a non-magnetic die pad. For example, a magnetic metal layer can be deposited under application of a suitable sputtering or electrodeposition process. Preferably, the LED die pad is formed by depositing one or more layers of soft magnetic material such as a nickel-iron alloy or permalloy.

The dependent claims and the following description disclose particularly advantageous embodiments and features of the invention. Features of the embodiments may be combined as appropriate. Features described in the context of one claim category can apply equally to another claim category.

In the following, it may be assumed that an LED die has the form and physical dimensions appropriate to a surface-mount manufacturing method. Such an LED die can have a very small size, and is generally a compact rectangular or square component. For example, an LED die may have a square footprint, with sides of less than 1 mm, and height that is only a fraction of its width. An LED die pad or electrode pad is correspondingly smaller, since two die pads (anode and cathode) must be formed on the underside of an LED die. The die pads can extend over most of the width of the underside of the LED die, and can be separated by a suitable gap. The material of the LED die pads may tend to corrode over time. Therefore, in a particularly preferred embodiment of the invention, the method comprises a step of applying a protective coating to the LED pads. For example, the sputtering or deposition procedure applied to form the LED die pads can be concluded by sputtering or depositing a thin layer of a noble metal to the outer surface of the LED pad.

Since an LED die is very small and light, it can be held in place on the carrier or PCB by a correspondingly small magnetic force. In a particularly preferred embodiment of the invention, the dimensions and/or material properties and/or relative positions of a magnet and the magnetic die pads are chosen to achieve an attractive force of at least 0.4 millinewton (mN), more preferably at least 0.6 mN, most preferably at least 0.8 mN between a magnet and the magnetic LED die pads. For example, for an LED with a mass of roughly 1 mg, an attractive force of 1 mN can be sufficient to achieve a force roughly 100 times greater than the gravitational force that would act on that LED. Preferably, an LED die pad has a relative permeability $\mu_r$ (the ratio of the permeability of the pad material to the permeability of free space $\mu_0$ to) of at least 5,000.

According to the invention, an alignment magnet is embedded within the body of the PCB. Preferably, an alignment magnet is embedded to a depth of at most 2.0 millimetres below the mounting surface of the carrier. In other words, the distance between the mounting surface of the carrier and the upper surface of the alignment magnet is at most 2.0 millimetres. In a further preferred embodiment of the invention, the upper surface of the alignment magnet is essentially flush with the mounting surface of the carrier.

One such embedded magnet or "magnetic inlay" can be embedded in the PCB for each LED die that will be placed onto the mounting surface of the PCB. Preferably, a magnetic inlay is embedded in the body of the carrier at a position determined by the positions of the PCB pads that will later connect to the LED die pads. The magnetic inlays can be embedded in the PCB prior to an etching step to prepare the conductive tracks and contact pads, or vice versa, as appropriate.

In a preferred embodiment of the invention, the thickness of an alignment magnet comprises at least 0.1 millimetres and at most 2.0 millimetres. Preferably, the lateral dimension or side length of an alignment magnet is at least 0.1 millimetres. Preferably, the lateral dimension or side length of an alignment magnet is at most 2.0 millimetres. The dimensions of an alignment magnet are preferably chosen to achieve an attractive force with a desired strength, and may also depend to some extent on the distance between the mounting pads.

As mentioned above, the electrical connection between LED die pad and PCB pad is no longer made by solder, and instead is made by the physical contact between these opposing surfaces. Therefore, in a preferred embodiment of the invention, these surfaces are prepared to ensure a sufficient degree of electrical conductivity. Additionally or as an alternative, the inventive method can comprise a step of applying a thin layer of electrically and thermally conductive material such as grease to the mounting pads prior to the alignment step. Such an electrically conductive layer can significantly improve the electrical connection between the LED die pads and their corresponding PCB pads, and can be applied in a straightforward dispensing, screen-printing, or ink-jet process, for example. An advantage of using such a layer is that the surfaces of the LED die pads and their corresponding PCB pads can be prepared in the usual manner, i.e. without requiring any additional effort to ensure a higher degree of smoothness. The material fills any voids arising from imperfections in the otherwise planar surfaces of the LED die pads and the PCB pads. An electrically and thermally conductive material layer can also improve the overall thermal performance of the assembly by facilitating heat transfer from the LED die pads to the PCB pads.

A PCB can typically have a thickness of 0.7 mm-3.0 mm, and any embedded magnetic inlay can preferably be dimensioned to fit inside such a PCB while allowing space for other elements such as intermediate dielectric layers and PCB pads. In a particularly preferred embodiment of the invention, a magnetic inlay is a permanent magnet which can be made from a "hard" material, for example from a rare-earth alloy such as neodymium ($Nd_2Fe_{14}B$), samarium-cobalt ($SmCo_5$, $Sm(Co,Fe,Cu,Zr)_7$), or from an Alnico alloy. Preferably, the alignment magnet has a magnetization of at least 750 $kAm^{-1}$. The material properties and dimensions of the magnet are preferably chosen to allow continuous reliable behaviour of the magnet—i.e. no significant reduction in the magnetic force of attraction—even at temperatures in the region of 150° C.

In a particularly preferred embodiment of the invention, the magnetic LED die pads and the alignment magnet(s) can be realized to achieve a specific configuration of magnetization directions acting in parallel to the PCB mounting surface. A magnetization direction may be visualised as an arrow pointing from a "south pole" of the magnet to the "north pole" of that magnet. In one such embodiment, the magnetization direction of the alignment magnet is parallel to an imaginary straight line connecting the PCB anode pad to the PCB cathode pad, and the magnetization direction of each LED die pad is antiparallel to the magnetization direction of the alignment magnet. By preparing the magnets in this way, an LED die approaching an alignment magnet will automatically rotate to align the magnetization directions of its die pads antiparallel to the magnetization direction of the alignment magnet. This property is put to good use in a "self-aligning" embodiment of the inventive method in which such LED dies are dispersed to float on a thin layer of liquid on the PCB and agitated. The LED dies automatically assume the "correct" position relative to the alignment magnet and will remain in that position owing to the force of magnetic attraction acting orthogonally to the PCB mounting surface. The liquid layer may comprise a solvent that evaporates. Alternatively, PCB may be placed in a bath and slowly raised during the alignment process to allow excess liquid to drain off the surface. Such a self-alignment method may be quicker than a pick-and-place process, especially as the number of LEDs per board increases.

To ensure that the LED dies remain in place in spite of the solderless connection to the PCB, the inventive method preferably comprises a step of applying an adhesive coating, either over the aligned LED dies and the carrier, or at the edges of the LEDs where they touch the carrier, to fix the positions of the aligned LED dies on the carrier. Such a coating can comprise a layer of glue, a laminate layer, or any other suitable layer. In a preferred embodiment of the invention, the coating comprises a material that undergoes shrinkage upon curing. This results in a force that acts to pull the LED dies toward the PCB mounting surface to maintain or improve the physical, and therefore electrical and thermal, connection between the LED die pads and the mounting pads.

In another embodiment of the invention, an arrangement of one or more external alignment magnets can be used during assembly of the device. In this embodiment, one or more external alignment magnets are used by a component placement system and are arranged to lie underneath the PCB with its embedded alignment magnet(s). During an alignment step, the external alignment magnet(s) create a strong magnetic field that increases the magnetization of the embedded alignment magnets and increases the force of attraction between the LED die pads and their corresponding PCB mounting pads, thereby assisting in the correct alignment of the LED die pads and their corresponding PCB mounting pads.

For example, a further alignment magnet can be a single large electromagnet that magnetizes all embedded alignment magnets. The LED dies can be placed over the PCB pads and dropped into place, for example using a pick-and-place tool as described above. The magnetic force of attraction ensures that an LED is held in place on the PCB once it is dropped by the pick-and-place tool.

The use of one or more external alignment magnets can allow the die pads and the embedded alignment magnets to be made of a "soft" magnetic material. For example, the die pads and/or the embedded alignment magnets may be made of a material such as a nickel-iron alloy or permalloy. Such materials are significantly easier to source and are more economical than the "hard" magnetic materials mentioned above. Preferably, the step of aligning the dies to their respective mounting pads is followed by a step of applying a coating as explained above to hold the dies in place on the PCB.

The technique of using an external alignment magnet to assist in the alignment step can allow the use of a very thin PCB with very thin embedded alignment magnets. For example, a PCB may be formed as a thin flexible foil with a thickness of only a small fraction of a millimetre. In this case, an embedded alignment magnet may have a thickness comparable to the thickness of the PCB foil.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
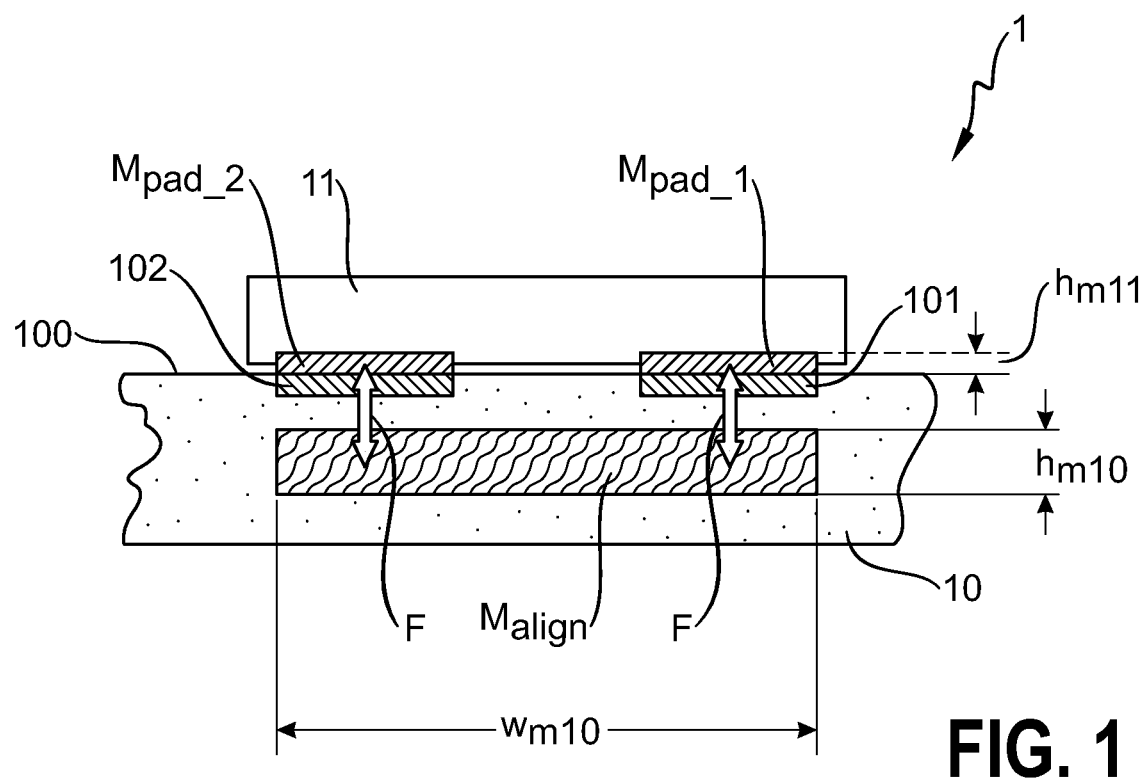
FIG. 1 shows a cross-section through an embodiment of the inventive LED assembly.
Figure 2:
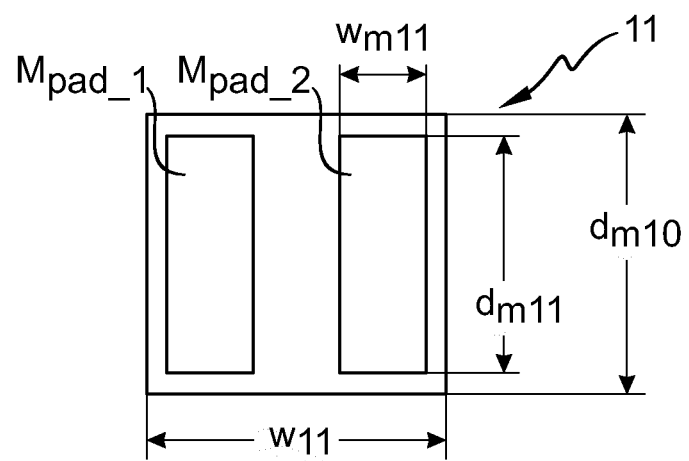
FIG. 2 shows a plan view from below of an embodiment of the inventive LED die.

FIG. 1 is a cross-section through an embodiment of the inventive LED assembly 1, and shows an LED die 11 in place on a PCB 10. An alignment magnet $M_{align}$ is embedded in the PCB 10, and is shown to extend over a distance spanning the PCB contacts 101, 102 for that LED die 11. The alignment magnet $M_{align}$ may be embedded to depth of up to 2.0 mm, i.e. its upper surface is up to 2.0 mm below the mounting surface 100 of the PCB 10. The LED die 11 has magnetic die pads $M_{pad\_1}$, $M_{pad\_2}$. The force of magnetic attraction F between the alignment magnet $M_{align}$ and the magnetic die pads $M_{pad\_1}$, $M_{pad\_2}$ is sufficient to hold the LED die 11 in place on the PCB 10. The electrical connection between the LED die 11 and the PCB 10 is therefore entirely solderless. FIG. 2 shows a plan view from below of an embodiment of the LED die 11, showing the magnetic die pads $M_{pad\_1}$, $M_{pad\_2}$ with a suitable gap between them, since one of the die pads is the anode of the LED, and the other die pad is the cathode. Here, the die 11 has an essentially square shape with a width $w_{11}$, which can be in the order of 1.0 mm for automotive (front, rear, other signalling, or interior), general illumination, display (direct emitting or backlighting), outdoor (street lighting), or camera flash applications. The dimensions of the alignment magnet $M_{align}$ such as its thickness $h_{m10}$, width $w_{m10}$ and depth $d_{m10}$ (shown here to be the same as the depth of the LED); the dimensions of a magnetic die pad $M_{pad\_1}$, $M_{pad\_2}$ such as its thickness $h_{m11}$, depth $d_{m11}$ and width $w_{m11}$; and the material properties of the alignment magnet $M_{align}$ and the magnetic die pads $M_{pad\_1}$, $M_{pad\_2}$ are chosen to achieve a suitably strong align force F that will securely hold the LED dies 11 in place in the intended product application.

Figure 3:
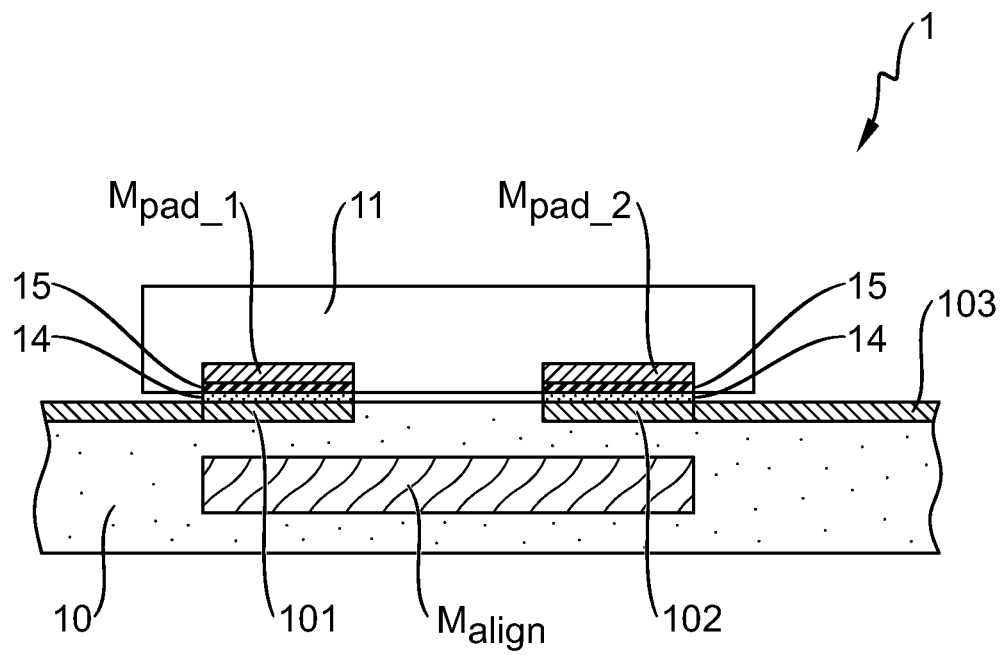
FIG. 3 shows a cross-section through a further embodiment of the inventive LED assembly.

FIG. 3 shows a cross-section through a further embodiment of the inventive LED assembly. Here, a layer of electrically conductive grease 14 has been applied to the PCB contact pads 101, 102 so that a favourable electrical (and thermal) connection is formed between the LED die pads $M_{pad\_1}$, $M_{pad\_2}$ and the PCB contact pads 101, 102. This exemplary embodiment also indicates a protective layer 15 of a material such as a noble metal, applied to the outer surface of each LED die pad $M_{pad\_1}$, $M_{pad\_2}$ to protect these against corrosion. The diagram also indicates a conductive track 103 (usually an etched copper track) for electrically connecting a PCB contact pad to another component or power pad, for example.

Figure 4:
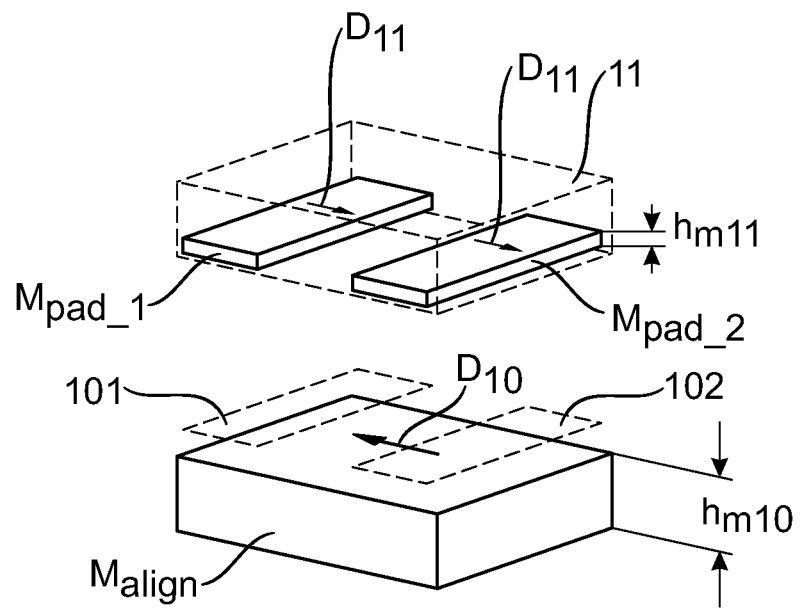
FIG. 4 illustrates the principle of self-alignment between an embodiment of the inventive LED die and an alignment magnet.

In the embodiments of FIGS. 1 and 3, the alignment magnet $M_{align}$ is embedded in the carrier 10. The LED dies 11 can be placed onto the PCB 10 using a conventional apparatus such as pick-and-place machine. Alternatively, a self-aligning property of magnets may be put to use during an alternative alignment step in the inventive method. FIG. 4 illustrates an embodiment in which the alignment magnet $M_{align}$ and the LED die pads $M_{pad\_1}$, $M_{pad\_2}$ have each been prepared to exhibit a magnetization direction $D_{10}$, $D_{11}$ that lies parallel to the surface of the PCB 10. Specifically, the alignment magnet $M_{align}$ has been prepared and embedded so that its magnetization direction $D_{10}$ corresponds to the direction between the two contact pads 101, 102 for that LED 11. Alternatively, the alignment magnet $M_{align}$ and the die pads $M_{pad\_1}$, $M_{pad\_2}$ could be prepared so that the magnetization directions are parallel to the gap between the die pads—this embodiment may be visualized by rotating the alignment magnet's magnetization direction $D_{10}$ of FIG. 4 through 90° in a clockwise direction, and by also rotating the die pad's magnetization direction $D_{11}$ through 90° to achieve the desired anti-parallel configuration.

Figure 5:
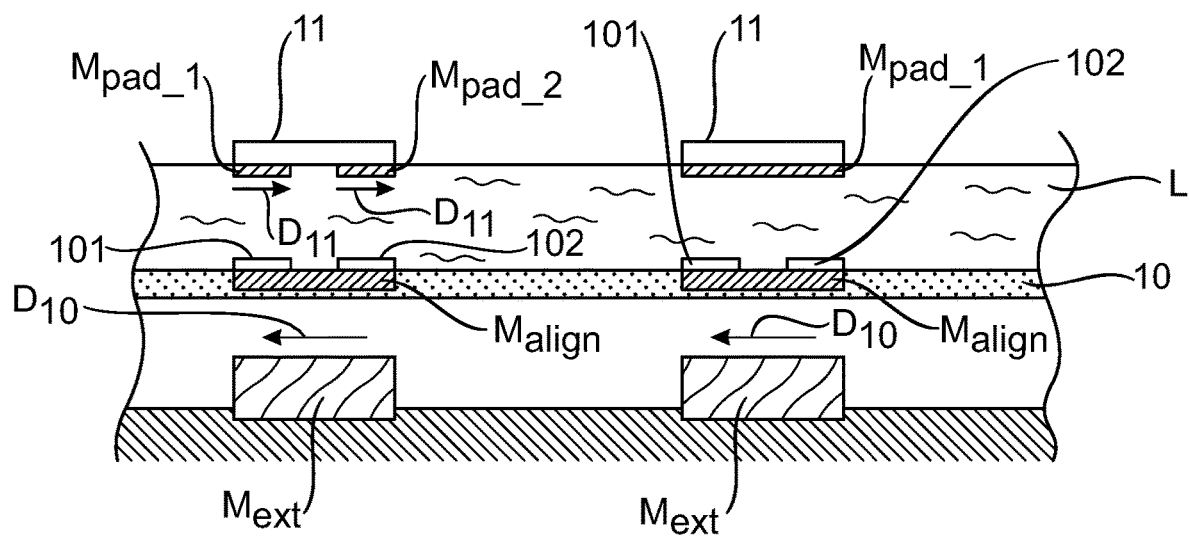
FIG. 5 illustrates a self-alignment stage in an embodiment of the inventive method.

FIG. 5 illustrates a self-alignment stage in an alternative embodiment of the inventive method. As indicated above, alignment magnets $M_{align}$ with a magnetization direction $D_{10}$ are embedded in the PCB 10. In this embodiment, however, one or more external alignment magnets $M_{ext}$ are arranged as part of a manufacturing apparatus 2 to lie below the PCB 10. The PCB is placed in a bath so that loose LED dies 11 can float on the surface of a liquid layer L on top of the PCB 10. The die pads $M_{pad\_1}$, $M_{pad\_2}$ of each LED die 11 have been prepared to have a magnetization direction $D_{11}$ as described above. The magnetic field of an alignment magnet $M_{align}$ will compel an LED die 11 in the vicinity to centre itself directly above the alignment magnet $M_{align}$ and rotate on the surface of the liquid L so that the magnetization direction $D_{11}$ of its die pads $M_{pad\_1}$, $M_{pad\_2}$ aligns anti-parallel to the magnetization direction $D_{10}$ of the alignment magnet $M_{align}$. In this exemplary embodiment, the embedded alignment magnets $M_{align}$ and/or the die pads $M_{pad\_1}$, $M_{pad\_2}$ can be made of a "soft" magnetic material. The external alignment magnets $M_{ext}$ serve to temporarily augment or amplify the force of magnetic attraction between the magnetically "soft" embedded alignment magnets $M_{align}$ and die pads $M_{pad\_1}$, $M_{pad\_2}$ by magnetizing them. In the diagram, the LED die 11 on the left has already aligned itself with the alignment magnet $M_{align}$ underneath. The LED die 11 on the right will rotate to align itself with the alignment magnet $M_{align}$ underneath. The liquid L can evaporate or be allowed to drain off once the LED dies 11 are in position over their respective contact pads. Since the LEDs 11 are free to move on the liquid L, this alignment process can be completed within a very short time. Once the PCB with its placed dies is removed from the influence of the external alignment magnets $M_{ext}$, the residual magnetic field between the embedded alignment magnets $M_{align}$ and die pads $M_{pad\_1}$, $M_{pad\_2}$ may be relatively weak. Therefore, an adhesive coating or shrink coating may be applied to assist in holding the dies in place on their contact pads 101, 102.

Figure 6:
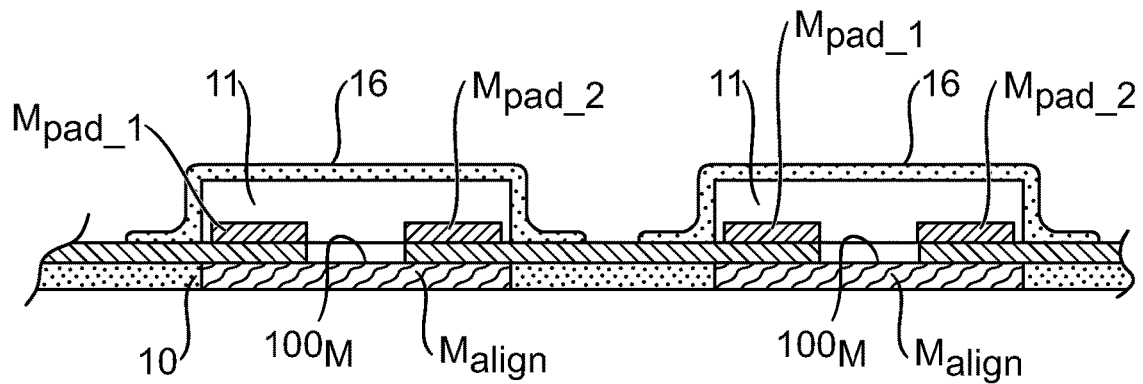
FIG. 6 shows a cross-section through a further embodiment of the inventive LED assembly.

FIG. 6 shows a cross-section through a further embodiment of the inventive LED assembly. Here, the carrier 10 is a very thin PCB foil 10 with correspondingly thin embedded alignment magnets $M_{align}$. The LED dies 11 have been aligned in the manner described in FIG. 5, for example, or by using a pick-and-place machine to position the LED dies 11 (with their magnetic die pads $M_{pad\_1}$, $M_{pad\_2}$) over alignment magnets $M_{align}$ and external alignment magnets $M_{ext}$ (not shown) that were arranged underneath the PCB foil 10 during assembly. Either way, a coating or covering 16 has been applied over the LED dies 11 to secure these to the PCB 10. The covering 16 can be a shrink coating that shrinks or tightens during curing, so that that the LEDs 11 are held securely into place on the PCB 10 even in the absence of any solder between the LED die pads $M_{pad\_1}$, $M_{pad\_2}$ and the PCB contact pads 101, 102. The covering 16 can be translucent and may coat also the outer surfaces of the LED dies 11, or it may be applied to only lie along the outer edges of the LED dies 11 (as well as the outer surface of the PCB 10).

Figure 7:
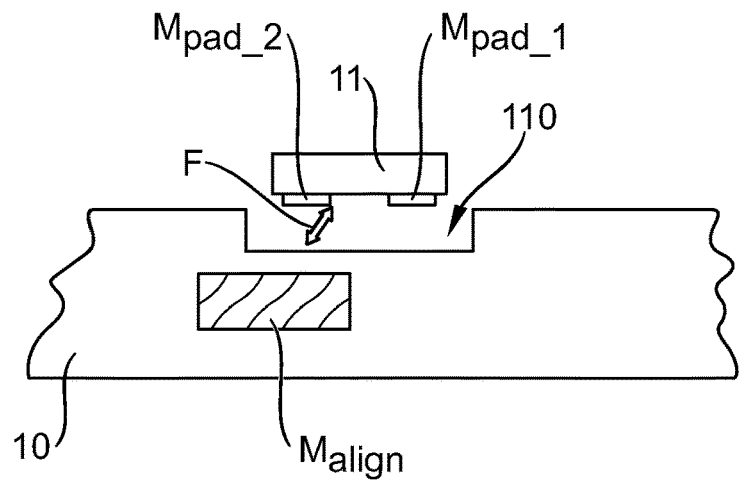
FIG. 7 shows a cross-section through a further embodiment of the inventive LED assembly in a first manufacturing stage.
Figure 8:
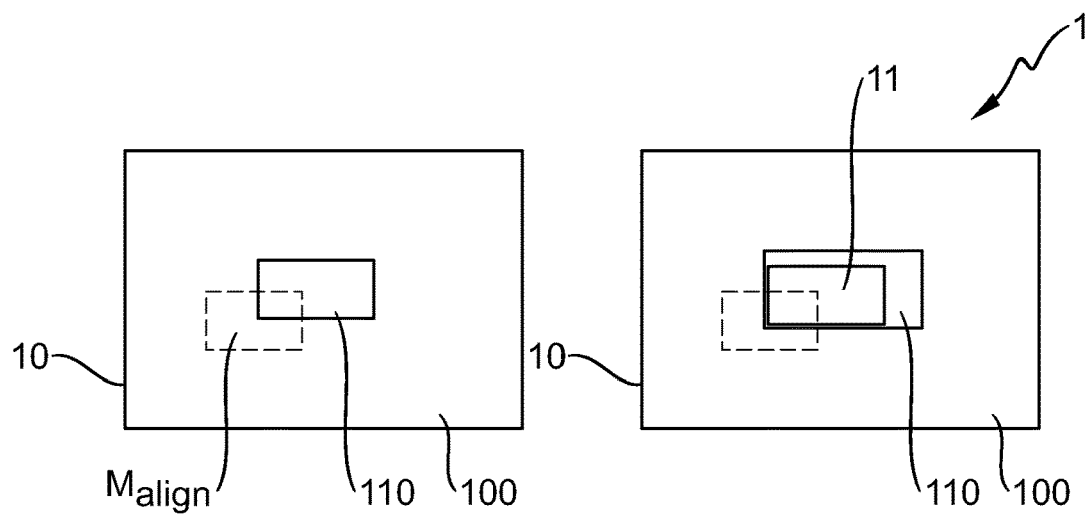
FIG. 8 shows plan views of the embodiment of FIG. 7.
Figure 9:
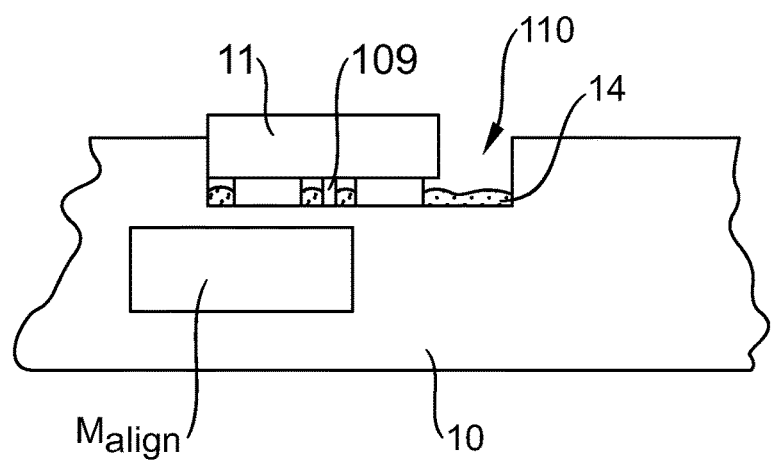
FIG. 9 shows a cross-section through the embodiment of FIG. 7 in a later manufacturing stage.

FIGS. 7-9 illustrate a further possible embodiment. In FIG. 7, a PCB 10 is shown to have a cut-out 110 or recess 110 shaped to accommodate an LED 11. An alignment magnet $M_{align}$ is embedded in the PCB 10, but is diagonally offset from the cut-out 110, as shown in the plan view given on the left-hand side of FIG. 8. While the diagram does not show PCB contacts for that LED die 11, these may be assumed to be present in the base of the cut-out 110, and may also be assumed to be electrically connected to etched copper tracks in the usual manner. When the LED 11 is placed over the PCB 10 or finds its way into the cut-out 110 via magnetic self-alignment, the force of magnetic attraction F will pull the LED 11 towards a corner of the recess 110 as shown on the right-hand side of FIG. 8. This embodiment can ensure a favourably accurate alignment in the X and Y directions. Since the magnetic inlay $M_{align}$ is offset in the direction of a corner of the cut-out 110, the magnetic field will compel the LED 11 into a corner of the cut-out 110 and the two side-walls at that corner will precisely define the X and Y position of the LED 11. In a further development of this embodiment, the cut-out 110 could be partially filled with a thermally conductive liquid adhesive 14 to improve the thermal contact from the LED 11 to the PCB 10. If the use of an electrically conductive liquid adhesive is desired, a "partition wall" 109 could be placed in the cut-out 110 or fabricated as part of the PCB 10 to electrically separate two wells of electrically conductive and thermally conductive liquid adhesive 14 that improve the electrical and thermal contact from the LED 11 to the PCB 10.

Although the present invention has been disclosed in the form of preferred embodiments and variations thereon, it will be understood that numerous additional modifications and variations could be made thereto without departing from the scope of the invention. For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

REFERENCE SIGNS

LED carrier assembly 1
carrier 10
mounting surface 100
magnet upper surface $100_M$
mounting pad 101, 102
conductive track 103
partition 109
recess 110
LED die 11
electrically conductive grease 14
protective coating 15
covering layer 16
manufacturing apparatus 2
magnetic die pad $M_{pad\_1}$, $M_{pad\_2}$
height $h_{m11}$
width $w_{m11}$
depth $d_{m11}$
alignment magnet $M_{align}$
external magnet $M_{ext}$
width $w_{m10}$
height $h_{m10}$
depth $d_{m10}$
liquid L
magnetic force F
magnetization direction D

The invention claimed is:

1. A method of manufacturing an LED carrier assembly, the method comprising:
   providing a carrier comprising a mounting surface with a plurality of pairs of mounting pads, each of the plurality of pairs of mounting pads comprising a first mounting pad and a second mounting pad;
   fully embedding a plurality of alignment magnets in the carrier such that each of the plurality of alignment magnets is disposed underneath a respective one of the plurality of pairs of mounting pads;
   providing a plurality of LED dies, each of the plurality of LED dies comprising an n-type region, a p-type region, a light-emitting region between the n-type region and the p-type region, and a pair of magnetic die pads, a first magnetic die pad of the pair of magnetic die pads being electrically coupled to the n-type region and a second magnetic die pad of the pair of magnetic die pads being electrically coupled to the p-type region; and
   aligning each of the plurality of LED dies with a respective one of the plurality of pairs of mounting pads by arranging the plurality of LED dies over the mounting surface of the carrier, each within magnetic range of one of the plurality of alignment magnets such that the first magnetic die pad of each of the pairs of LED dies is magnetically coupled to the first mounting pad of the opposing pair of mounting pads with an attractive force of at least 0.4 mN and the second magnetic die pad of each of the pairs of LED dies is magnetically coupled to the second mounting pad of the opposing pair of mounting pads with the attractive force of at least 0.4 mN such that the plurality of LED dies are mounted on the carrier without use of an adhesive.

2. The method according to claim 1, wherein the embedding the plurality of alignment magnets comprises embedding the plurality of alignment magnets to a depth of at most 2.0 mm below the mounting surface of the carrier.

3. The method according to claim 1, wherein the embedding the plurality of alignment magnets comprises embedding the plurality of alignment magnets such that an upper surface of the plurality of alignment magnets is essentially flush with the mounting surface of the carrier.

4. The method according to claim 1, further comprising at least one of:
   applying an electrically conductive grease to the plurality of mounting pads prior to aligning each of the pair of magnetic die pads to one of the plurality of mounting pads; and
   applying a protective coating to at least one of the pair of magnetic die pads.

5. The method according to claim 1, further comprising:
   submerging the mounting surface of the carrier in a liquid; and
   floating the plurality of LED dies on the liquid in preparation for the aligning.

6. The method according to claim 1, further comprising applying a covering layer over the aligned LED dies to fix the positions of the aligned LED dies relative to the carrier.

7. The method according to according to claim 6, wherein the covering layer comprises a material that undergoes shrinkage upon curing.

8. The method of claim 1, wherein the alignment magnet is a permanent magnet.

9. An LED carrier assembly comprising:
   a carrier comprising a mounting surface with a plurality of pairs of mounting pads, each of the plurality of pairs of mounting pads comprising a first mounting pad and a second mounting pad;
   a plurality of alignment magnets fully embedded within a body of the carrier, each of the plurality of alignment magnets disposed underneath a respective one of the plurality of pairs of mounting pads; and
   a plurality of LED dies, wherein each of the plurality of LED dies comprises an n-type region, a p-type region, a light-emitting region between the n-type region and the p-type region, and a pair of magnetic die pads, a first magnetic die pad of the pair of magnetic die pads being electrically coupled to the n-type region and a second magnetic die pad of the pair of magnetic die pads being electrically coupled to the p-type region, each of the plurality of LED dies disposed on the carrier opposite a respective one of the plurality of pairs of mounting pads, and the plurality of alignment magnets and each pair of magnetic die pads being configured to magnetically couple the first magnetic die pad of each of the pairs of LED dies to the first mounting pad of the opposing pair of mounting pads and the second magnetic die pad of each of the pairs of LED dies to the second mounting pad of the opposing pair of mounting pads with an attractive force of at least 0.4 mN such that the plurality of LED dies are mounted on the carrier without use of an adhesive.

10. The LED carrier assembly according to claim 9, wherein at least one of a thickness of each of the plurality of alignment magnets and a side length of each of the plurality of alignment magnets comprises at least 0.1 mm and at most 2.0 mm.

11. The LED carrier assembly according to claim 9, wherein each of the plurality of alignment magnets is a permanent magnet.

12. The LED carrier assembly according to claim 9, wherein corresponding ones of the plurality of alignment magnets and corresponding ones of the plurality of pairs of magnetic die pads each comprise a magnetization direction parallel to the mounting surface of the carrier.

13. The LED carrier assembly according to claim 9, wherein each of the plurality of pairs of magnetic die pads comprises at least one of a magnetic anode die pad and a magnetic cathode die pad.

14. The LED carrier assembly according to claim 9, wherein a relative permeability of each of the magnetic die pads in the plurality of pairs of magnetic die pads comprises at least 5,000.

15. The LED carrier assembly according to claim 9, wherein at least one of the dimensions, material properties and relative positions of each of the plurality of alignment magnets and the magnetic die pads are chosen to achieve an attractive force of at least 0.6 mN between each of the plurality of pairs of magnetic die pads and the alignment magnet under each of the plurality of pairs of magnetic die pads.

16. The LED carrier assembly according to claim 9, wherein at least one of the dimensions, material properties and relative positions of each of the plurality of alignment magnets and the magnetic die pads are chosen to achieve an attractive force of at least 0.8 Mn between each of the plurality of pairs of magnetic die pads and the alignment magnet under each of the plurality of pairs of magnetic die pads.

17. The LED carrier assembly according to claim 9, wherein each of the plurality of alignment magnets is a body of ferromagnetic material.

18. The LED carrier assembly according to claim 9, wherein each of the plurality of alignment magnets is embedded to a depth of at most 2.0 mm below the mounting surface of the carrier.

19. The LED carrier assembly according to claim 9, wherein an upper surface of each of the plurality of alignment magnets is essentially flush with the mounting surface of the carrier.

\* \* \* \* \*